(12) United States Patent
Park et al.

(10) Patent No.: US 9,209,067 B2
(45) Date of Patent: Dec. 8, 2015

(54) GAP-FILL METHODS

(71) Applicants: Rohm and Haas Electronic Materials LLC, Marlborough, MA (US); Dow Global Technologies LLC, Midland, MI (US)

(72) Inventors: Jong Keun Park, Westborough, MA (US); Cheng-Bai Xu, Southborough, MA (US); Phillip D. Hustad, Natick, MA (US); Mingqi Li, Shrewsbury, MA (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 0 days.

(21) Appl. No.: 14/542,428

(22) Filed: Nov. 14, 2014

(65) Prior Publication Data

US 2015/0132921 A1    May 14, 2015

Related U.S. Application Data

(60) Provisional application No. 61/904,455, filed on Nov. 14, 2013.

(51) Int. Cl.
*H01L 21/762* (2006.01)

(52) U.S. Cl.
CPC ............... *H01L 21/76224* (2013.01)

(58) Field of Classification Search
None
See application file for complete search history.

(56) References Cited

U.S. PATENT DOCUMENTS

| | | |
|---|---|---|
| 5,854,112 A | 12/1998 | Krautschneider et al. |
| 6,066,574 A | 5/2000 | You et al. |
| 6,749,765 B2 | 6/2004 | Rutter, Jr. et al. |
| 7,361,718 B2 | 4/2008 | Takei et al. |
| 7,517,633 B2 | 4/2009 | Takei et al. |
| 8,007,979 B2 | 8/2011 | Takei et al. |
| 2003/0146416 A1* | 8/2003 | Takei et al. ............ 252/500 |

FOREIGN PATENT DOCUMENTS

EP    1398831 A2    3/2004

* cited by examiner

*Primary Examiner* — Stanetta Isaac
(74) *Attorney, Agent, or Firm* — Jonathan D. Baskin

(57) ABSTRACT

Provided are gap-fill methods. The methods comprise: (a) providing a semiconductor substrate having a relief image on a surface of the substrate, the relief image comprising a plurality of gaps to be filled; (b) applying a gap-fill composition over the relief image, wherein the gap-fill composition comprises a self-crosslinkable polymer and a solvent, wherein the self-crosslinkable polymer comprises a first unit comprising a polymerized backbone and a crosslinkable group pendant to the backbone; and (c) heating the gap-fill composition at a temperature to cause the polymer to self-crosslink. The methods find particular applicability in the manufacture of semiconductor devices for the filling of high aspect ratio gaps.

10 Claims, 4 Drawing Sheets

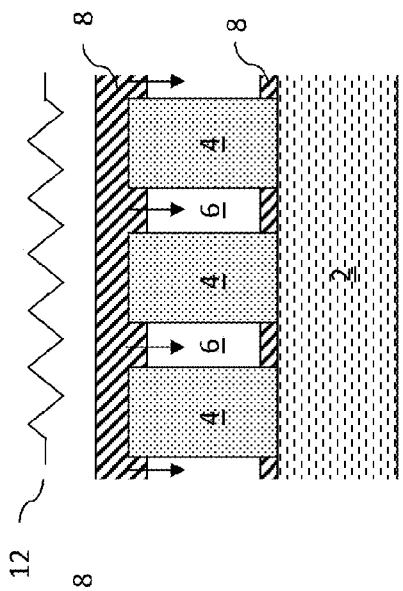
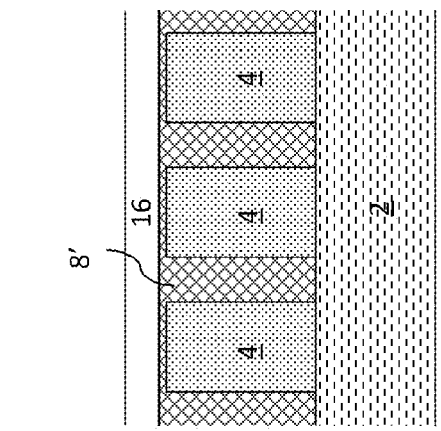
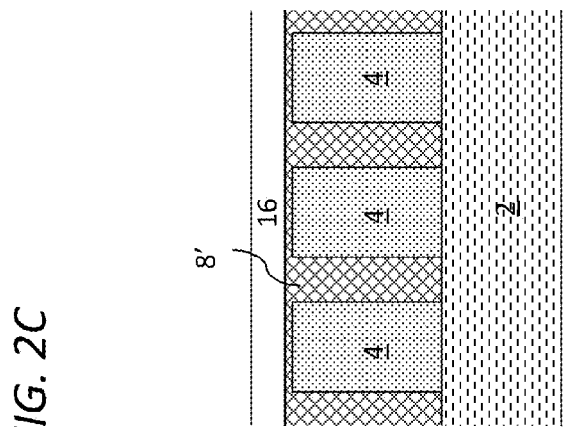
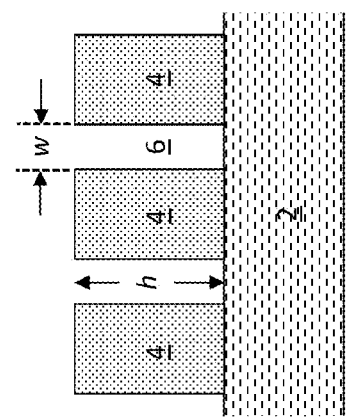
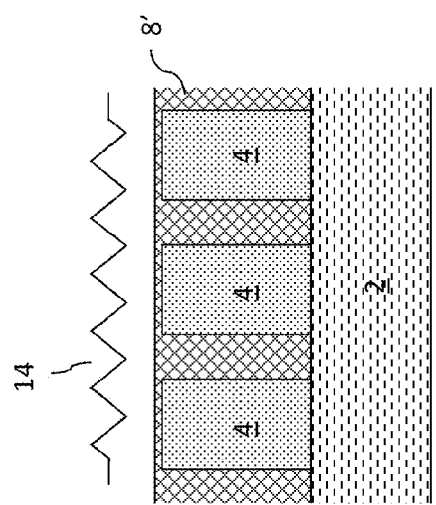
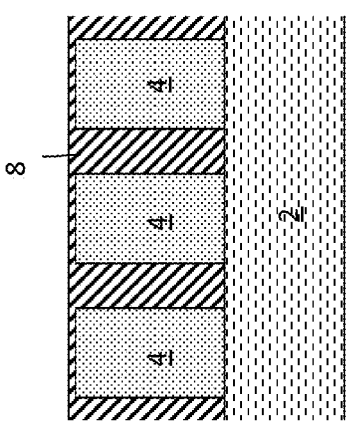
FIG. 2A  FIG. 2B  FIG. 2C
FIG. 2D  FIG. 2E  FIG. 2F

GAP-FILL METHODS

This application claims the benefit of priority under 35 U.S.C. §119(e) to U.S. Provisional Application No. 61/904,455, filed Nov. 14, 2013, the entire contents of which are incorporated herein by reference.

FIELD

The invention relates generally to the manufacture of electronic devices. More specifically, this invention relates to gap-fill methods having applicability to semiconductor device manufacturing. The methods find particular use in the filling of high aspect ratio gaps such as trenches for device isolation.

INTRODUCTION

In the semiconductor manufacturing industry, large numbers of electronic devices are fabricated on a semiconductor substrate. With higher integration densities that occur with each new design node, devices become packed together using smaller and smaller spacing between them. This can result in increased current leakage between adjacent transistors, adversely impacting device operation. A known technique for isolation of adjacent transistors is shallow trench isolation (STI) described, for example, in U.S. Pat. No. 5,854,112. In one such process, trench structures are formed by first imaging trench patterns in a photoresist layer. The photoresist pattern is then transferred to the underlying substrate, for example, the substrate silicon or other layer(s) on the substrate, typically by anisotropic dry-etching. The trenches are then filled with a dielectric material such as a silicon oxide using, for example, a chemical vapor deposition (CVD) or spin-on glass (SOG) process. Excess dielectric material is typically removed using chemical mechanical planarization (CMP).

As devices approach sub-20 nanometer geometries, features such as trenches for device isolation typically have high aspect ratios. Such high aspect ratio features can be difficult to fill using the conventional STI approach without also creating a significant amount of voids. The presence of voids can give rise to poor electrical isolation, resulting in current leakage between adjacent devices.

There is a continuing need in the semiconductor manufacturing industry for improved methods which are useful in the filling of gaps including those having high aspect ratios.

SUMMARY

In accordance with a first aspect of the invention, gap-fill methods are provided. The methods comprise: (a) providing a semiconductor substrate having a relief image on a surface of the substrate, the relief image comprising a plurality of gaps to be filled; (b) applying a gap-fill composition over the relief image, wherein the gap-fill composition comprises a self-crosslinkable polymer and a solvent, wherein the self-crosslinkable polymer comprises a first unit comprising a polymerized backbone and a crosslinkable group pendant to the backbone; and (c) heating the gap-fill composition at a temperature to cause the polymer to self-crosslink. The methods find particular applicability in the manufacture of semiconductor devices for the filling of high aspect ratio gaps.

The terminology used herein is for the purpose of describing particular embodiments only and is not intended to be limiting of the invention. As used herein, the singular forms "a", "an" and "the" are intended to include the plural forms as well, unless the context clearly indicates otherwise.

BRIEF DESCRIPTION OF THE DRAWINGS

The present invention will be described with reference to the following drawings, in which like reference numerals denote like features, and in which:

FIG. 2A-F illustrates a second gap-fill process flow in accordance with the invention;

DETAILED DESCRIPTION

Figure 1B:
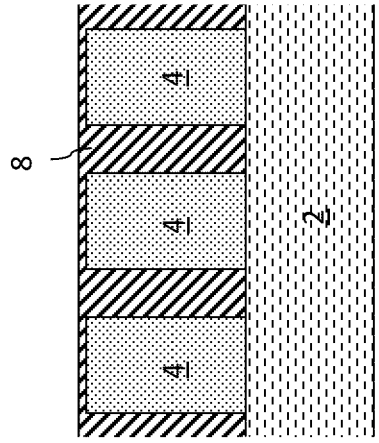
FIG. 1A-D illustrates a first gap-fill process flow in accordance with the invention.

The gap-fill methods of the invention involve application of a gap-fill composition over a relief image on a surface of the substrate. The gap-fill compositions include a self-crosslinkable polymer and a solvent, and may include one or more additional optional components. The self-crosslinkable polymer contains a first unit comprising a polymerized backbone and a crosslinkable group pendant to the backbone. As used herein, the term "self-crosslinkable" means that crosslinking reaction can occur between units of the same polymer without the aid of an additive catalyst or crosslinking agent. The crosslinking reaction may additionally take place between units of plural polymers, whether of the same or different types. The self-crosslinking reaction is typically effected by elevating the temperature of the self-crosslinkable polymer. In accordance with certain aspects of the invention, the self-crosslinking reaction can occur with no by-product. Such a crosslinking reaction can be beneficial from the standpoint of minimizing or preventing the occurrence of outgassing, which can be deleterious in view of void formation and/or the generation of defects.

In a first aspect, the self-crosslinkable polymer comprises a first unit that includes an aromatic group fused to a cyclobutene ring, hereafter an "arylcyclobutene". The aromatic group can include a single or plural aromatic rings, for example, one, two, three, four or more aromatic rings. Where plural aromatic rings are present in the unit, the aromatic rings can themselves form a fused (e.g., naphthyl, anthracenyl, pyrenyl) and/or tethered (e.g., biphenyl) structure. The aromatic group is optionally substituted, for example, with one or more of alkyl, cycloalkyl or halo. The cyclobutene group is optionally substituted, for example, with one or more of hydroxy, alkoxy, amine or amide.

Arylcyclobutene group-containing monomers useful in making the self-crosslinkable polymer include, but are not limited to, those of the general formula (I-A) or (I-B) as follows:

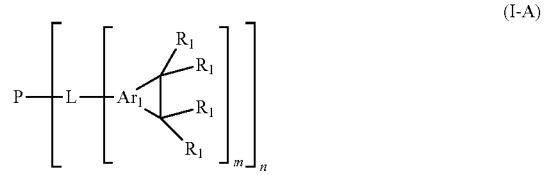

(I-A)

-continued

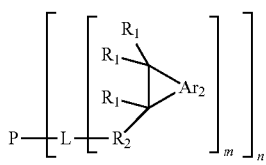
(I-B)

wherein: P is a polymerizable functional group, for example, vinyl, (alkyl)acrylate or cyclic olefin; L is a single bond or an m+1-valent linking group chosen from optionally substituted linear or branched aliphatic and aromatic hydrocarbons, and combinations thereof, optionally with one or more linking moiety chosen, for example, from —O—, —S—, —COO—, —CONR$_3$— and —OCONH—, wherein R$_3$ is chosen from hydrogen and substituted and unsubstituted C$_1$ to C$_{10}$ linear, branched and cyclic hydrocarbons, preferably alkyl; Ar$_1$ and Ar$_2$ are, respectively, trivalent and divalent aryl groups, and the carbon atoms of the cyclobutene ring are bonded to adjacent carbon atoms on the same aromatic ring of Ar$_1$ or Ar$_2$; m and n are each an integer of 1 or more; each R$_1$ is independently a monovalent group; and R$_2$ is a single bond or a divalent group. Preferably, Ar$_1$ and Ar$_2$ include 1, 2 or 3 aromatic carbocyclic or heteroaromatic rings. It is preferred that the aryl group comprises a single aromatic ring, and more preferably a phenyl ring. The aryl group is optionally substituted with 1 to 3 groups chosen from (C$_1$-C$_6$)alkyl, (C$_1$-C$_6$) alkoxy, and halo, preferably with one or more of (C$_1$-C$_6$) alkyl, (C$_1$-C$_3$)alkoxy, and chloro, and more preferably with one or more of (C$_1$-C$_3$)alkyl and (C$_1$-C$_3$)alkoxy. It is preferred that the aryl group is unsubstituted. It is preferred that m=1 or 2, and more preferably m=1. It is preferred that n=1-4, more preferably n=1 or 2, and yet more preferably n=1. Preferably, R$_1$ is chosen from H and (C$_1$-C$_6$)alkyl, and more preferably from H and (C$_1$-C$_3$)alkyl. Preferably, R$_2$ is chosen from a single bond, (C$_1$-C$_6$)alkylene, and more preferably from a single bond and (C$_1$-C$_3$)alkylene.

The polymerizable functional group P can be chosen, for example, from the following general formulae (II-A) and (II-B):

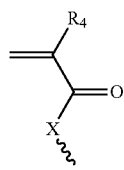
(II-A)

wherein R$_4$ is chosen from hydrogen, fluorine, C$_1$-C$_3$ alkyl and C$_1$-C$_3$ fluoroalkyl; and X is oxygen or is represented by the formula NR$_5$, wherein R$_5$ is chosen from hydrogen and substituted and unsubstituted C$_1$ to C$_{10}$ linear, branched and cyclic hydrocarbons, preferably alkyl; and

(II-B)

wherein R$_6$ is chosen from hydrogen, fluorine, C$_1$-C$_3$ alkyl and C$_1$-C$_3$ fluoroalkyl. Additional suitable polymerizable functional groups include, for example, norbornenes, cyclic siloxanes, cyclic ethers, alkoxysilanes, novolacs, functional groups such as phenols and/or aldehydes, carboxylic acids, alcohols and amines.

Arylcyclobutene monomers useful in the invention can be prepared by any suitable means, such as those described in M. Azadi-Ardakani et al, 3,6-*Dimethoxybenzocyclobutenone: A Reagent for Quinone Synthesis, Tetrahedron*, Vol. 44, No. 18, pp. 5939-5952, 1988; J. Dobish et al, *Polym. Chem.*, 2012, 3, 857-860 (2012); U.S. Pat. Nos. 4,540,763; 4,812,588; 5,136,069; 5,138,081; and International Pat. App. No. WO 94/25903. Arylcyclobutenes useful in making the monomers are commercially available under the Cyclotene™ brand, available from The Dow Chemical Company.

Suitable arylcyclobutene monomers include, for example, those which form the following polymerized units:

(I-1)

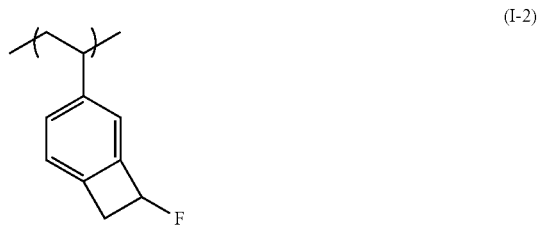
(I-2)

(I-3)

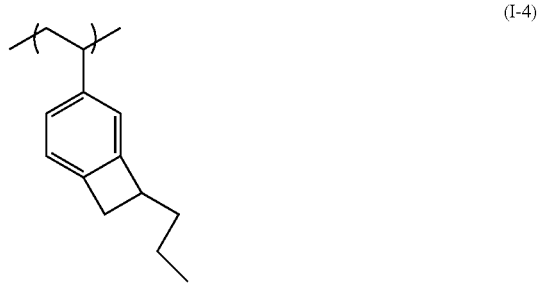
(I-4)

(I-5)

(I-6)
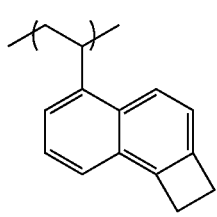
(I-7)
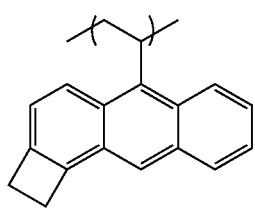
(I-8)
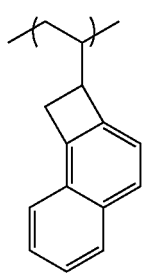
(I-9)
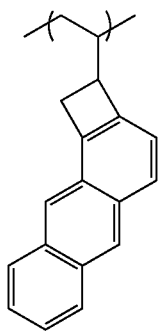
(I-10)
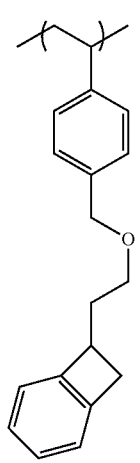
(I-11)
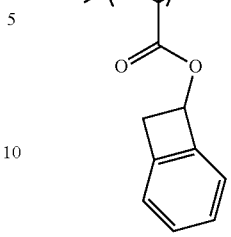
(I-12)
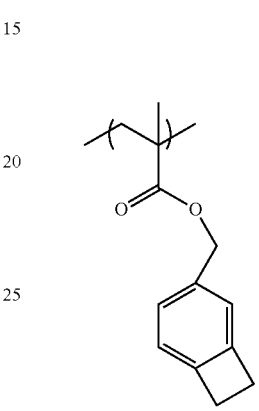
(I-13)
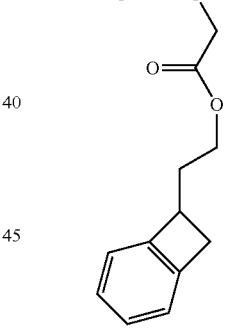
(I-14)
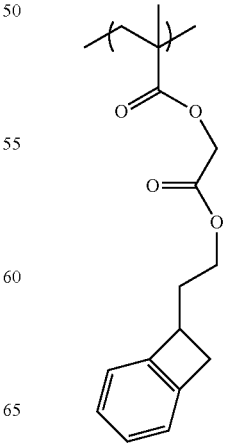

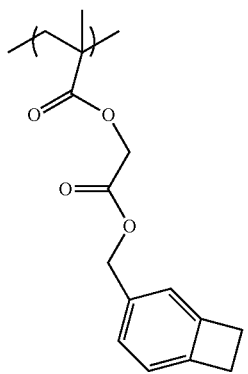
(I-15)

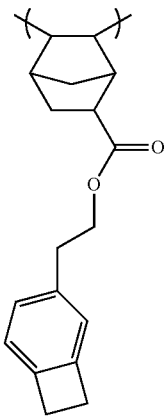
(I-19)

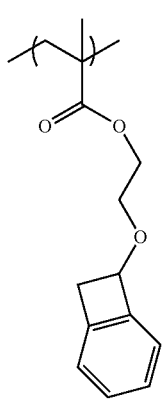
(I-16)

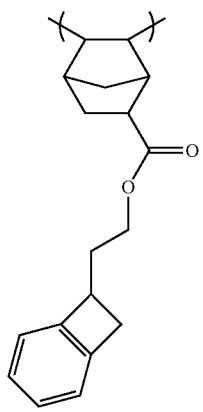
(I-17)

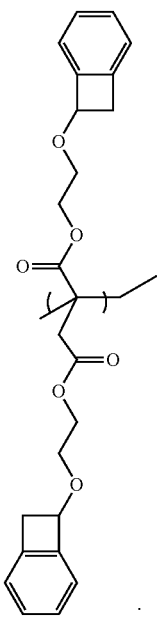
(I-20)

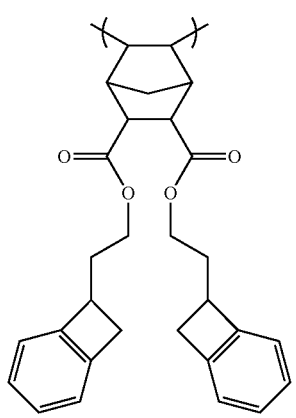
(I-18)

Of these, 4-vinylbenzocyclobutene monomers and monomers containing benzocyclobutene moieties are typical. The first unit is typically present in the self-crosslinkable polymer in an amount of from 1 to 100 mol %, for example, from 1 to 50 mol %, from 1 to 20 mol %, or from 1 to 10 mol %, based on the polymer.

Other suitable chemistries lending self-crosslinkable properties to the polymer can be used. For example, in a further aspect, the self-crosslinkable polymer can include units formed from azide-alkyne coupling reactions (see, e.g., Spruell et al., J. Am. Chem. Soc., 2011, 133, 16698-16706 and Mansfield et al., Polym. Chem., 2010, 1, 1560-1598). In accordance with this method, the polymer comprises a unit comprising an azide and a unit comprising an alkyne. The azide and alkyne can be present in the same unit or in different units. Typically, the azide and alkyne are present in different units. A suitable azide-alkyne crosslinkable polymer useful in the present invention is described below in general formula (III):

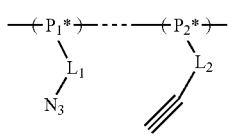
(III)

wherein $P_1^*$ and $P_2^*$ are each chosen from polymerized functional groups, for example, polymerized vinyl, (alkyl)acrylate or cyclic olefin groups; and $L_1$ and $L_2$ are each chosen from a single bond or divalent linking group chosen from optionally substituted linear or branched aliphatic and aromatic hydrocarbons, and combinations thereof, optionally with one or more linking moiety chosen, for example, from —O—, —S—, —COO—, —CONR$_7$— and —OCONH—, wherein $R_7$ is chosen from hydrogen and substituted and unsubstituted $C_1$ to $C_{10}$ linear, branched and cyclic hydrocarbons, preferably alkyl. The polymerized functional groups $P_1^*$ and $P_2^*$ can be chosen, for example, from those formed from the polymerizable groups of general formulae (II-A) and (II-B), described above. A self-crosslinking reaction in accordance with this aspect of the invention using the polymer of general formula (III) is shown below:

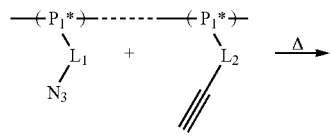

Suitable azide monomers for use in making the azide-alkyne self-crosslinkable polymer include, for example, one or more of the following:

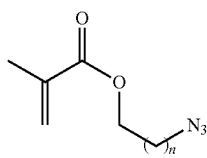
(AZ-1)

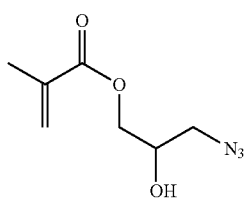
(AZ-2)

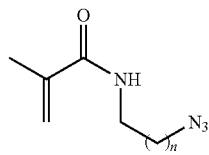
(AZ-3)

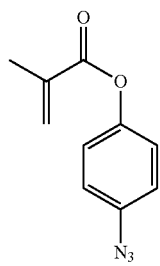
(AZ-4)

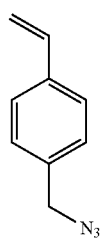
(AZ-5)

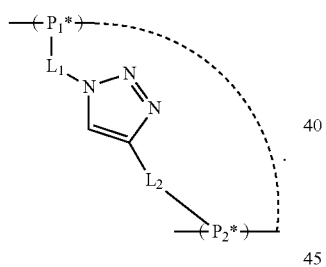
(AZ-6)

wherein n is an integer from 0 to 5. Suitable alkyne monomers for use in making the azide-alkyne self-crosslinkable polymer include, for example, one or more of the following:

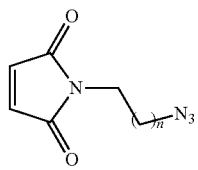
(AL-1)

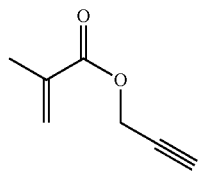
(AL-2)

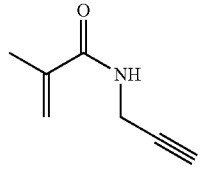

(AL-3)

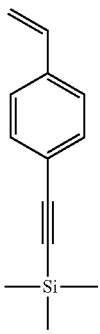

(AL-4)

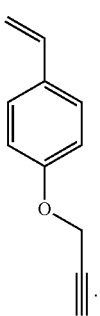

(AL-5)

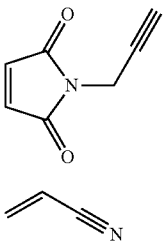

(AL-6)

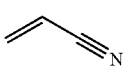

For a self-crosslinkable polymer based on azide-alkyne chemistry, the azide group-containing units and the alkyne-group-containing units are each typically present in the self-crosslinkable polymer in an amount of from 1 to 50 mol %, for example, from 1 to 25 mol %, from 1 to 10 mol %, or from 1 to 5 mol %, based on the polymer. The azide-containing and alkyne-containing units are typically present in the polymer in the same or substantially the same amount.

A further suitable chemistry for imparting self-crosslinkable properties to the polymer is in-situ ketene formation from Meldrum's acid derivatives, described, for example, in Leibfarth et al., *Nature Chemistry*, 2010, 2, 207-212, and Leibfarth et al., *Chem. Sci.*, 2012, 3, 766. A general mechanism for this reaction is described below:

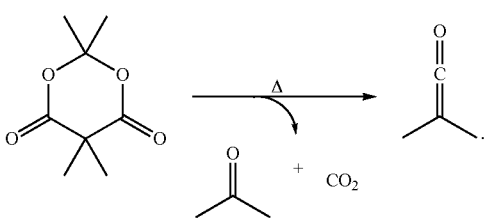

Suitable self-linkable polymers based on this chemistry include, for example ketene group-containing units of general formula (IV) as follows:

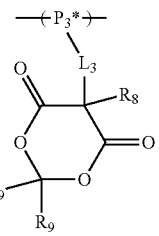

(IV)

wherein $P_3^*$ is chosen from polymerized functional groups, for example, polymerized vinyl, (alkyl)acrylate or cyclic olefin groups; L3 is chosen from a single bond or divalent linking group chosen from optionally substituted linear or branched aliphatic and aromatic hydrocarbons, and combinations thereof, optionally with one or more linking moiety chosen, for example, from —O—, —S—, —COO—, —CONR$_{10}$— and —OCONH—, wherein $R_{10}$ is chosen from hydrogen and substituted and unsubstituted $C_1$ to $C_{10}$ linear, branched and cyclic hydrocarbons, preferably alkyl; $R_8$ represents a hydrogen atom or a $C_1$ to $C_{10}$ organic group such as a substituted or unsubstituted $C_1$ to $C_{10}$ or $C_1$ to $C_6$ alkyl alkyl, or $C_2$ to $C_{10}$ or $C_2$ to $C_6$ alkenyl group; and $R_9$ is independently a substituted or unsubstituted $C_1$ to $C_6$ organic group such as a $C_1$ to $C_6$ alkyl or acetyloxy group, together optionally forming a ring such as a $C_3$ to $C_6$ or $C_4$ to $C_6$ cycloalkyl ring. The polymerized functional group $P_3^*$ can be chosen, for example, from those formed from the polymerizable groups of general formulae (II-A) and (II-B), described above. If desired, the $R_9$ groups can be selected such that their cleavage during crosslinking minimizes their impact on outgassing.

A self-crosslinking reaction in accordance with this aspect of the invention using the polymer of general formula (IV) is shown below:

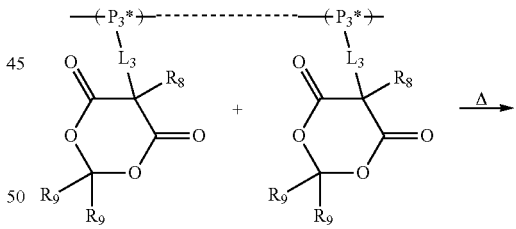

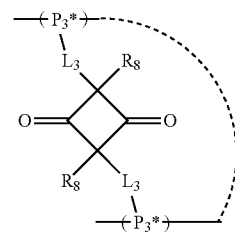

Exemplary monomers for the polymerized units of general formula (IV) include the following:

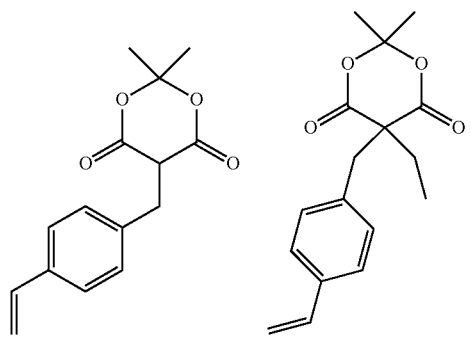
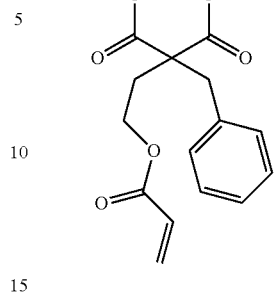
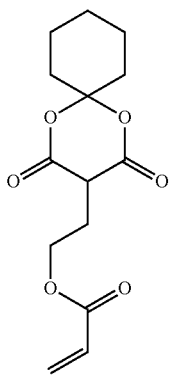
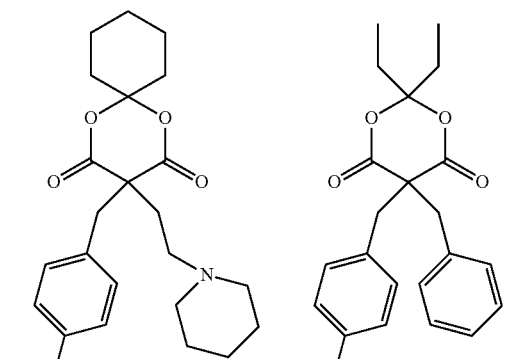
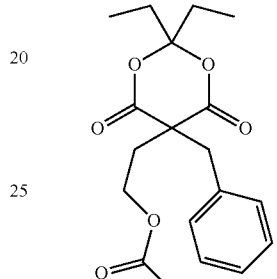
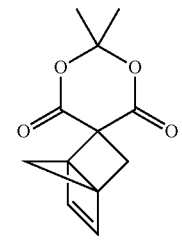
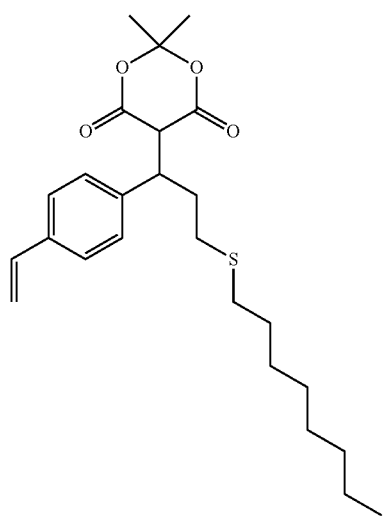
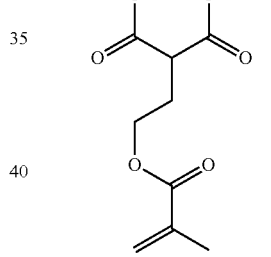
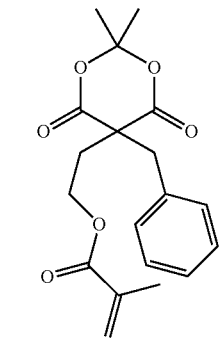
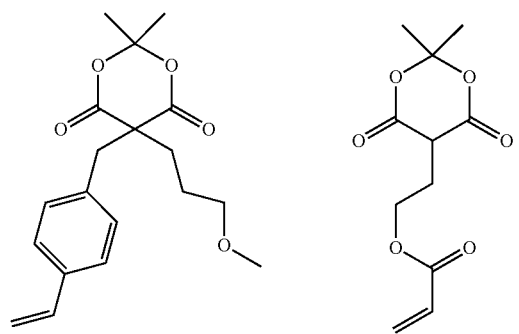
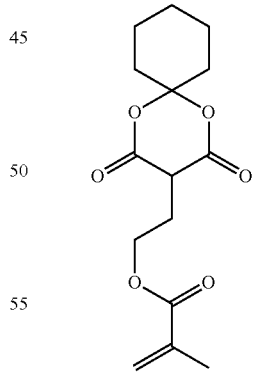
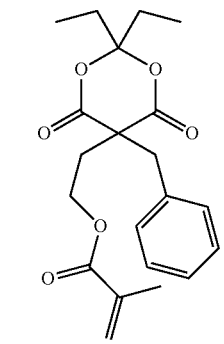

The self-crosslinkable polymer can include one or more additional units. The polymer can, for example, include one or more additional units for purposes of tuning surface energy, optical properties (e.g., n and k values) and/or glass transition temperature of the self-crosslinkable polymer. Suitable units include, for example, one or more units chosen from the following general formulae (IV) and (V):

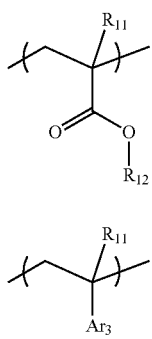
(IV)

(V)

wherein $R_{11}$ is independently chosen from hydrogen, fluorine, $C_1$-$C_3$ alkyl and $C_1$-$C_3$ fluoroalkyl, $R_{12}$ is chosen from optionally substituted $C_1$ to $C_{10}$ alkyl; and $Ar_3$ is an aryl group. Preferably, $Ar_3$ include 1, 2 or 3 aromatic carbocyclic and/or heteroaromatic rings. It is preferred that the aryl group comprises a single aromatic ring, and more preferably a phenyl ring. The aryl group is optionally substituted with, for example, $(C_1$-$C_6)$alkyl, $(C_1$-$C_6)$alkoxy or halo. It is preferred that the aryl group is unsubstituted.

Exemplary suitable structures for the additional units include the following:

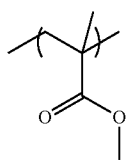
(III-1)

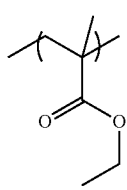
(III-2)

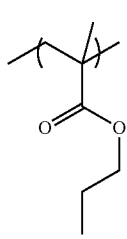
(III-3)

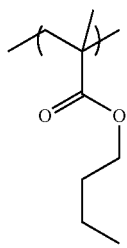
(III-4)

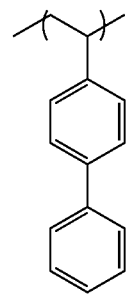
(IV-1)

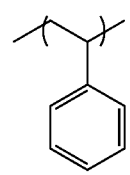
(IV-2)

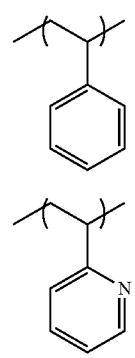
(IV-3)

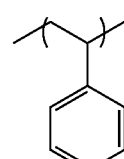
(IV-4)

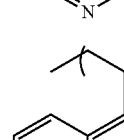
(IV-5)

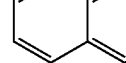

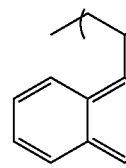
(IV-6)

The one or more additional units if present in the self-crosslinkable polymer can be used in an amount of up to 99 mol %, preferably from 80 to 98 mol % based on the polymer.

The self-crosslinkable polymer preferably has a weight average molecular weight Mw of less than 50,000, preferably, a Mw of 5000 to 30,000. It is believed that lower molecular weight polymers allow for easier filling of narrow gaps as a result of their less bulky nature as compared with higher molecular weight polymers.

The self-crosslinkable polymer preferably has a polydispersity index (PDI) of less than 1.5, and more preferably less than 1.3. It is believed that a lower PDI for the self-crosslinkable polymer improves the ability to fill the gaps for the same reasons described above with respect to molecular weight.

It is believed that control of molecular weight and polydispersity index of the self-crosslinkable polymer allows for the filling of narrow and/or high aspect ratio gaps, such as trenches, contact holes and pores. This control can, for example, be achieved by performing ionic (anionic or cationic) polymerization or controlled radical polymerization, for example, nitroxide-mediated polymerization (NMP), reversible addition fragmentation chain transfer (RAFT) polymerization, or atom transfer radical polymerization (ATRP).

Preferably, the glass transition temperature ($T_g$) of the polymer is 10° C. or more lower than the onset temperature ($T_o$) for crosslinking of the polymer, preferably 20° C. or more or 30° C. or more lower than the onset temperature for crosslinking of the polymer. As referenced herein, the glass transition temperature is as determined by as measured by differential scanning calorimetry (DSC, rate of increase of 20° C./min). This temperature difference between onset temperature and glass transition temperature is defined by the following formula:

$$\Delta T_{o-g} = T_o - T_g.$$

By selection of a self-crosslinkable polymer having a sufficiently high $\Delta T_{o-g}$, premature crosslinking of the polymer can be avoided when the composition is heated, for example, during softbake and during optional gap-fill bake processes described below. In addition, gap-fill compositions in accordance with the invention containing a self-crosslinkable polymer having sufficiently high $\Delta T_{o-g}$ typically have very good planarization. The self-crosslinkable polymer is typically present in the gap-fill composition in an amount of from 80 to 100 wt %, for example, from 90 to 100 wt % or from 95 to 100 wt %, based on total solids of the composition.

Suitable self-crosslinkable polymers include, for example, the following:

(P-1)
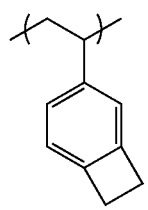

(P-2)
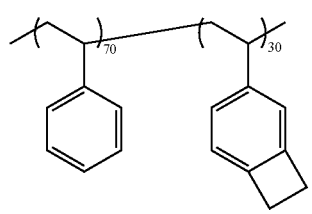

(P-3)
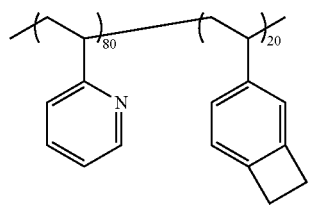

(P-4)
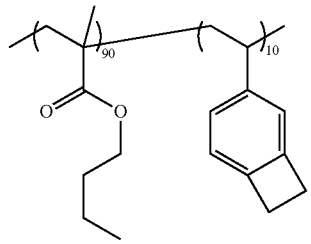

(P-5)
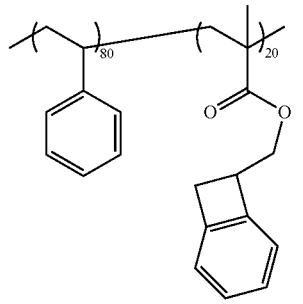

(P-6)
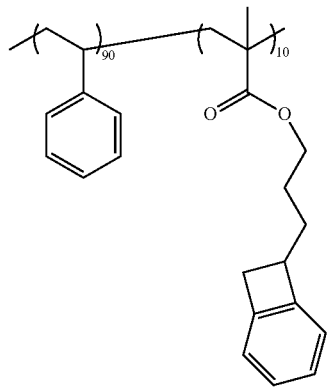

(P-7)
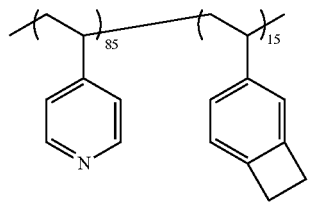

(P-8)
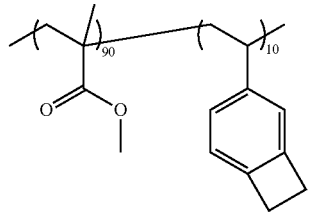

(P-9)
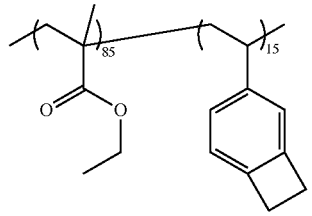

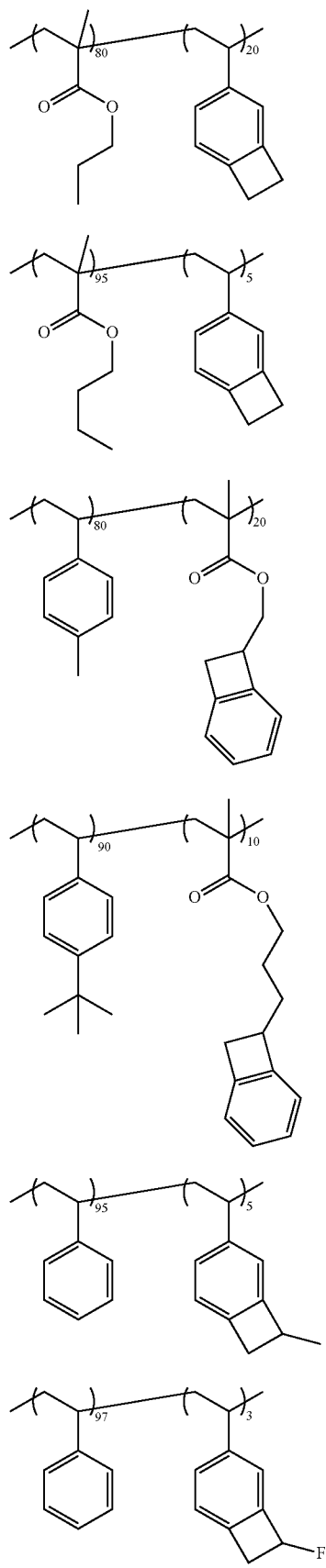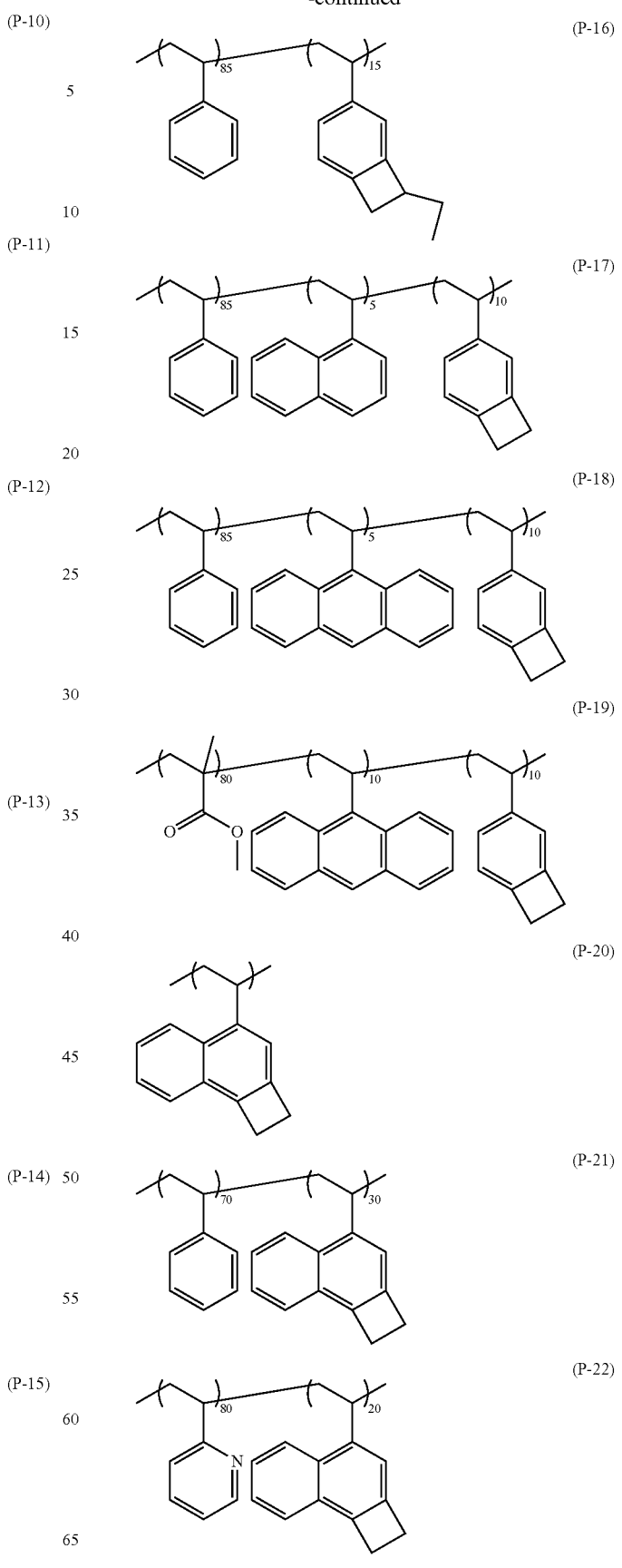

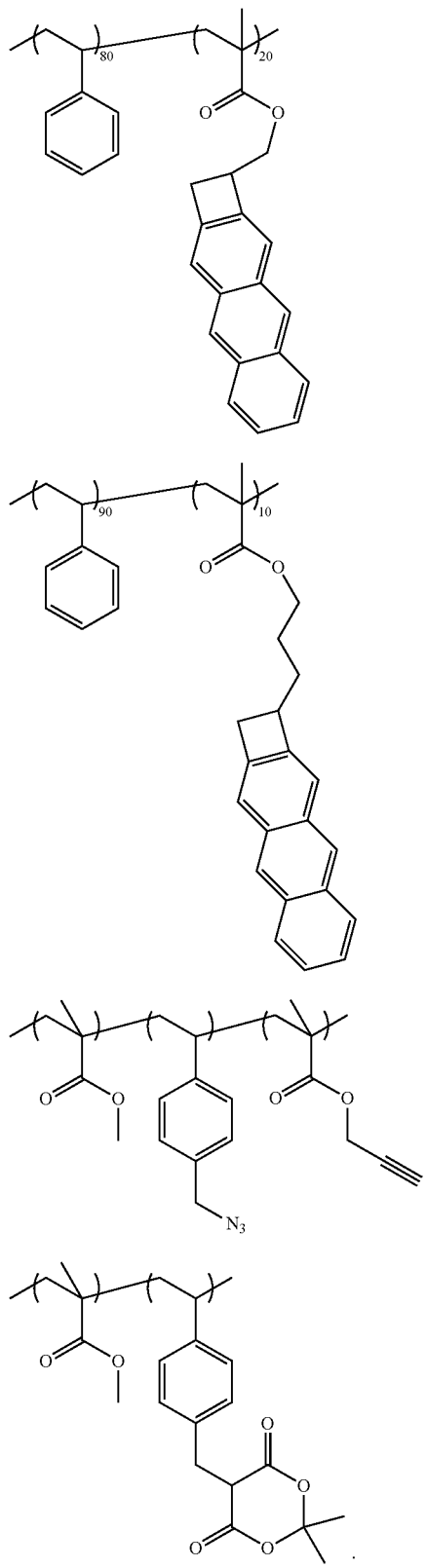

(P-23)
(P-24)
(P-25)
(P-26)

The gap-fill composition further includes a solvent which can include a single solvent or a solvent mixture. Suitable solvent materials to formulate and cast the gap-fill composition exhibit very good solubility characteristics with respect to the non-solvent components of the gap-fill composition, but do not appreciably dissolve the underlying relief image or other materials of the substrate surface coming into contact with the gap-fill composition. The solvent is typically chosen from water, aqueous solutions, organic solvents and mixtures thereof. Suitable organic solvents for the gap-fill composition include, for example: alcohols such as straight, branched or cyclic $C_4$-$C_9$ monohydric alcohol such as 1-butanol, 2-butanol, isobutyl alcohol, tert-butyl alcohol, 2-methyl-1-butanol, 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; alkyl esters such as alkyl acetates such as n-butyl acetate, propionates such as n-butyl propionate, n-pentyl propionate, n-hexyl propionate and n-heptyl propionate, and alkyl butyrates such as n-butyl butyrate, isobutyl butyrate and isobutyl isobutyrate; ketones such as 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; ethers such as isopentyl ether and dipropylene glycol monomethyl ether; and mixtures containing one or more of these solvents. Of these organic solvents, alcohols, aliphatic hydrocarbons and ethers are preferred. The solvent component of the gap-fill composition is typically present in an amount of from 80 to 99 wt %, more typically, from 90 to 99 wt % or from 95 to 99 wt %, based on the total weight of the gap-fill composition.

The gap-fill composition may include one or more optional additives including, for example, surfactants and antioxidants. Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable nonionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL® and DYNOL®. Additional suitable surfactants include other polymeric compounds such as the tri-block EO-PO-EO co-polymers PLURONIC® 25R2, L121, L123, L31, L81, L101 and P123 (BASF, Inc.). Such surfactant and other optional additives if used are typically present in the composition in minor amounts such as from 0.01 to 10 wt % based on total solids of the gap-fill composition.

An antioxidant can be added to prevent or minimize oxidation of organic materials in the gap-fill composition. Suitable antioxidants include, for example, phenol-based antioxidants, antioxidants composed of an organic acid derivative, sulfur-containing antioxidants, phosphorus-based antioxidants, amine-based antioxidants, antioxidant composed of an amine-aldehyde condensate and antioxidants composed of an amine-ketone condensate. Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butyl.hydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethylamino-p-cresol, 6-(4-hydroxy-3,5-di-tert-butyl.anilino)2,4-bis.octyl-thio-1,3,5-triazine, n-octadecyl-3-(4'-hydroxy-3',5'-di-tert-butyl.phenyepropionate, octylated phenol, aralkyl-substituted phenols, alkylated p-cresol and hindered phenol; bis-, tris- and poly-phenols such as 4,4'-dihydroxy.diphenyl, methylene.bis (dimethyl-4,6-phenol), 2,2'-methylene-bis-(4-methyl-6-tert-butylphenol), 2,2'-methylene-bis-(4-methyl-6-cyclohexyl.phenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-crosslinked polyvalent alkylphenol, 4,4'-butylidenebis-(3-methyl-6-tert-butylphenol), 1,1-bis-(4-hydroxyphenyl)-cyclohexane, 2,2'-dihydroxy-3,3'-di-(α-methylcyclohexyl)-5,5'-dimethyl.diphenylmethane, alkylated bisphenol, hindered bisphenol, 1,3,5-trimethyl-2,4,6-tris(3,5-di-tert-butyl-4-hydroxybenzyl)benzene, tris-(2-methyl-4-hydroxy-5-tert-butylphenyl)butane, and tetrakis-[methylene-3-(3',5'-di-tert-butyl-4'-hydroxyphenyepropionate]methane. Suitable antioxidants are commercially available, for example, Irganox™ antioxidants (Ciba Specialty Chemicals Corp.). The antioxidants if used are typically present in the gap-fill composition in an amount of from 0.01 to 10 wt % based on total solids of the gap-fill composition.

As the polymer is self-crosslinkable, the gap-fill composition does not require an additive crosslinking agent to effect crosslinking of the polymer. Preferably, the gap-fill composition is free of such additive crosslinking agents, as two separate crosslinking reactions would occur during processing, i.e., (i) self-crosslinking, and (ii) crosslinking by reaction of the polymer with the crosslinking agent. Because it would be difficult to match the temperatures at which these two mechanisms occur, control of the crosslinking reactions can be difficult. In addition, crosslinking agents can be thermally unstable, which can result in evaporation and void formation during subsequent processing. Further, phase separation between the self-crosslinkable polymer and additive crosslinking agents can occur, resulting in nonuniform crosslinking.

The gap-fill compositions can be prepared following known procedures. For example, the compositions can be prepared by dissolving the solid components of the composition in the solvent components. The desired total solids content of the compositions will depend on factors such as the desired final layer thickness. Typically, the solids content of the gap-fill compositions is from 1 to 10 wt %, more typically, from 1 to 5 wt %, based on the total weight of the composition.

Methods of the invention in accordance with a first aspect will now be described with reference to FIG. 1A-D. FIG. 1A depicts in cross-section a semiconductor substrate 2. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon, and may have one or more layers and patterned features formed on a surface thereof. Layers forming part of the substrate may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers such as single-crystal silicon, carbon layers and combinations thereof. The layers can be formed by various techniques, for example, chemical vapor deposition (CVD) such as plasma-enhanced CVD, low-pressure CVD or epitaxial growth, physical vapor deposition (PVD) such as sputtering or evaporation, electroplating, or a liquid coating technique such as spin-coating.

The uppermost layer of the substrate includes a relief image 4 that defines gaps 6 to be filled. The gaps to be filled may be present in the base substrate material itself or in a layer formed over the base substrate material and can take various forms. The gaps can, for example, take the form of trenches, holes or pores and, advantageously, can be extremely narrow in width and having high aspect ratios.

The relief image typically is formed by a lithographic process, for example, a photolithographic or self-assembly process such as directed self-assembly (DSA). An etching process such as an anisotropic dry etch is typically used for pattern transfer to an underlying layer from which the relief image and gaps are formed. In the illustrated embodiment, the gaps extend completely through the material layer from which the relief image is formed, exposing the underlying substrate. It may be desirable that the gaps extend only partially through the material layer. In the case of a photolithography process, it is preferable to use an exposure radiation of less than 200 nm in wavelength such as 193 nm or an EUV wavelength (e.g., 13.4 nm), or electron beam exposure. The gaps can take the form, for example, of trenches or holes having a height h and a width w, and can be of relatively narrow width and large height. Processes and compositions in accordance with the invention are suitable for use in the filling of gaps having relatively large aspect ratios. As used herein, aspect ratio (AR) is defined as AR=h/w, wherein h is the gap height and w is the gap width. Typically, the gap width is from 1 nm to 200 nm, for example, 1 nm to 100 nm, 1 nm to 50 nm or 1 nm to 25 nm, and is preferably less than 50 nm, for example, less than 20 nm, less than 15 nm, less than 10 nm or less than 5 nm. The aspect ratio is typically from 1 to 10, for example, from 1 to 5 or from 2 or more such as 2 to 4 or more.

As shown in FIG. 1B, a gap-fill composition 8 as describe herein is applied to the wafer surface over the relief image 4. The gap-fill composition can be applied to the substrate by spin-coating, dipping, roller-coating or other conventional coating technique. Of these, spin-coating is typical and preferred. For spin-coating, the solids content of the gap-fill composition can be adjusted to provide a desired film thickness based upon the specific coating equipment utilized, the viscosity of the solution, the speed of the coating tool and the amount of time allowed for spinning. The desired coated thickness of the gap-fill composition will depend, for example, on the geometry of the gaps to be filled. A typical thickness for the gap-fill composition 8 is from about 200 to 3000 Å.

The gap-fill composition is typically next softbaked at a temperature and time to evaporate residual solvent from the layer. The softbake temperature is lower than the onset temperature to avoid premature crosslinking of the polymer. The softbake can be conducted with a hotplate or oven, with a hotplate being typical. The softbake can, for example, be conducted on a hotplate of a wafer track also used for coating of the gap-fill composition. The softbake temperature and time will depend, for example, on the particular composition and thickness of the gap-fill composition. The softbake is typically conducted at a temperature of from about 90 to 150° C., and a time of from about 30 to 90 seconds.

Figure 1D:
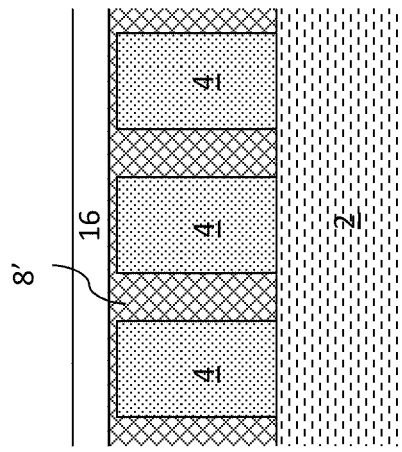
Figure 1A:
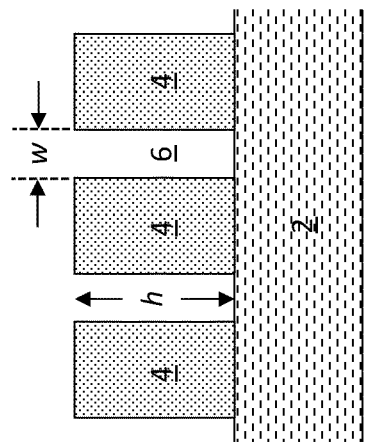
Figure 1C:
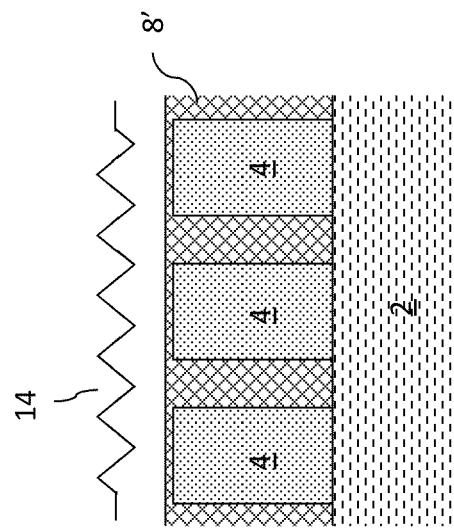

With reference to FIG. 1C, the composition is next heated at a temperature and time to cause the self-crosslinkable polymer to self-crosslink, thereby forming a crosslinked polymer 8'. The crosslinking bake can be conducted on a hotplate or in an oven 14, with a hotplate being typical. The crosslinking bake can, for example, be conducted on a hotplate of a wafer track also used for coating of the gap-fill composition. The crosslinking bake temperature and time will depend, for example, on the particular composition and thickness of the softbaked gap-fill composition. The crosslinking bake is typically conducted at a temperature of from about 200 to 300° C., and a time of from about 30 seconds to 30 minutes. The crosslinking bake can be conducted, for example, by heating the gap-fill composition at a single temperature or by ramping the temperature. The softbake and crosslinking bake can be conducted in a single process using the same heater, for example, by ramping the temperature from softbaking to crosslinking temperature.

Following crosslinking of the gap-fill composition, further processing of the substrate is conducted to form a final device, which can include a memory (e.g., DRAM) or logic device. The further processing can include, for example, one or more of formation of a layer 16 over the substrate as shown in FIG. 1D, polishing, chemical-mechanical planarization (CMP), ion implantation, annealing, CVD, PVD, epitaxial growth, electroplating and lithographic techniques such as DSA and photolithography. Advantageously, coating of a liquid layer containing a solvent, for example, by spin-coating, directly over the crosslinked gap-fill composition, can be conducted without intermixing with the underlying cross-linked material.

FIG. 2A-F illustrates a method in accordance with a further aspect of the invention, wherein application of the gap-fill composition 8 to the wafer 2 does not completely fill the gaps, as shown in FIGS. 2A and 2B. This can occur, for example, for very fine gaps, high viscosity gap-fill compositions and/or higher molecular weight self-crosslinkable polymers. Depending on the softbake temperature, gap-fill composition and gap dimensions and geometry, partial or complete gap-filling may occur during softbake if the polymer viscosity is sufficiently reduced. Except as otherwise indicated, the description above with respect to the process shown in FIG. 1 applies also to the process described with reference to FIG. 2.

Where gap-filling is incomplete following coating and soft-bake, the softbaked gap-fill composition can be heated in a gap-fill bake at a temperature that is greater than the softbake temperature and for a time effective to cause the gap-fill composition to fill the plurality of gaps. As shown in FIG. 2C, the gap-fill bake can be conducted with a hotplate or oven 12, with a hotplate being typical. The gap-fill bake can, for example, be conducted on a hotplate of a wafer track also used for coating of the gap-fill composition and softbake. The gap-fill bake temperature and time will depend, for example, on the particular composition and thickness of the softbaked gap-fill composition. The gap-fill bake is typically conducted at a temperature of from about 150 to 200° C., and a time of from about 30 seconds to 10 minutes. Preferably, the gap-fill bake temperature is 10° C. or more lower than the onset temperature, preferably 20° C. or more or 30° C. or more lower than the onset temperature of the composition. Preferably, the gap-fill bake temperature is 15° C. or more lower than the crosslinking bake temperature, preferably 25° C. or more or 35° C. or more lower than the crosslinking bake temperature. During the gap-fill bake process, the viscosity of the softbaked gap-fill composition 8 becomes lower, allowing the material to fill gaps 6, as shown in FIGS. 2C and 2D.

With reference to FIG. 2E, the composition is next heated at a temperature that is greater than the temperature of the gap-fill bake to cause the self-crosslinkable polymer to self-crosslink. The crosslinking bake can be conducted on a hotplate or in an oven 14, with a hotplate being typical. The crosslinking bake can, for example, be conducted on a hotplate of a wafer track also used for coating of the gap-fill composition. The crosslinking bake temperature and time will depend, for example, on the particular composition and thickness of the softbaked gap-fill composition. The crosslinking bake is typically conducted at a temperature of from about 200 to 300° C., and a time of from about 30 seconds to 30 minutes. Optionally, the gap-fill bake and crosslinking bake can be conducted in a single process. The gap-fill and crosslinking bake can, for example, be conducted sequentially using the same heating tool. The heating can be conducted, for example, by continuously ramping the temperature or using a terraced temperature profile to perform both gap-fill and crosslinking baking functions.

The following non-limiting examples are illustrative of the invention.

EXAMPLES

Synthesis of 4-Vinylbenzocyclobutene

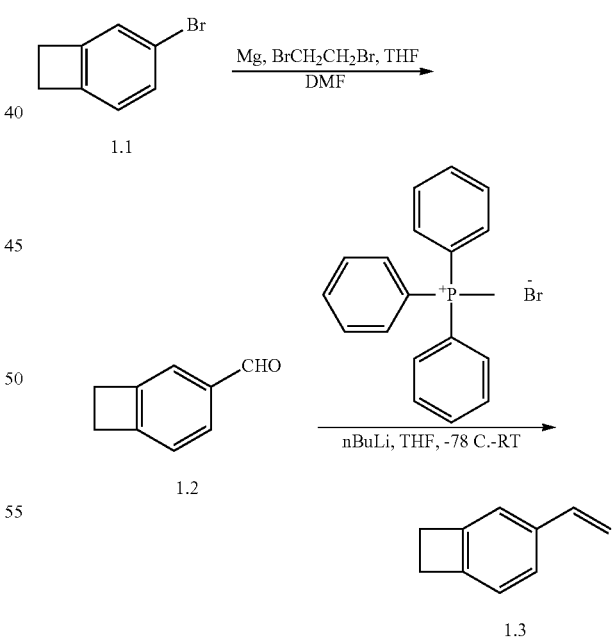

4-Carboxaldehydebenzocyclobutene (1.2)

To a 500 mL flask was added 50 mL anhydrous tetrahydrofuran (THF), Mg turnings (2.88 g, 120 mmol), and 1,2-dibromoethane (4 drops). The reaction mixture was then heated under reflux for 15 minutes. 4-Bromobenzocyclobutene (1.1, 20 g, 109 mmol) in 25 mL anhydrous THF was added dropwise to form the Grignard reagent. After addition and rinsing the dropping funnel with 25 mL of anhydrous THF, the reaction mixture was heated for an additional 45 minutes under reflux to give a green brown solution. The reaction mixture was then cooled to 0° C. Dimethylformamide (DMF) (15 mL, 210 mmol) was added dropwise to the solution, and the reaction mixture was heated under reflux for 15 minutes. The reaction mixture was poured onto 150 g of ice, acidified and neutralized with saturated NaHCO$_3$ solution. The crude product was extracted with ethyl acetate, the organic phase was filtered over Celite, and evaporation of the solvent gave the crude product. The product was purified by column chromatography using 10% diethyl ether/hexane as eluting solvents to give the corresponding aldehyde (1.2, 12 g, 82%) as a colorless liquid. $^1$H NMR (300 MHz, CDCl$_3$): d 9.9 (s, 1H), 7.65 (dd, 1H), 7.50 (s, 1H), 7.14 (dd, 1H), 3.15 (s, 4H).

4-Vinylbenzocyclobutene (1.3)

To a 500 mL round bottom neck flask was added methyltriphenylphosphonium bromide 1.1 (48.6 g, 136.2 mmol), 220 mL of anhydrous THF, and the solution was cooled to −78 C. n-BuLi (2.5 M in hexane, 52.8 mL, 132 mmol) was added dropwise, and the reaction mixture was allowed to warm to room temperature. The yellow-orange solution was cooled to −78 C, and the aldehyde 1.2 (14.32 g, 108.4 mmol), diluted in anhydrous THF (70 mL) added slowly. The mixture was warmed to room temperature and stirring continued for 2 h. The reaction was treated sequentially with saturated NH$_4$Cl and saturated NaHCO$_3$ solution and the crude product was filtered over Celite, washed with diethyl ether/hexane (1:1), and evaporated to dryness (no heat) to give the crude product. Further purification by column chromatography using 5% diethyl ether/hexane as eluting solvents followed by vacuum distillation (75 C, 1.0 mm) gave the pure 4-Vinylbenzocyclobutene 1.3 as a colorless liquid (11 g, 78%). $^1$H NMR (300 MHz, CDCl$_3$): δ 7.26 (d, 1H), 7.20 (s, 1H), 7.04 (d, 1H), 6.74 (dd, 1H), 5.70 (d, 1H), 5.20 (d, 1H), 3.19 (s, 4H).

Self-Crosslinkable Polymer Preparation

Polymer P25: P(S-r-VBCB) (90/10)

Styrene and 4-vinylbenzocyclobutene (VBCB) 1.3 monomers were passed through an alumina column to remove inhibitors. 26.341 g of styrene, 3.659 g of VBCB, 0.2286 g of N-tert-butyl-N-(2-methyl-1-phenylpropyl)-O-(1-phenylethyl)hydroxylamine, and 0.0114 g of 2,2,5-Trimethyl-4-phenyl-3-azahexane-3-nitroxide were charged into a 100 mL Schlenk flask. The reaction mixture was degassed by three freeze-pump-thaw cycles and then the flask was charged with nitrogen and sealed. The reaction flask was next heated at 120° C. for 24 hours. The polymerization mixture was allowed to cool down to room temperature and was diluted with tetrahydrofuran (THF). Polymer precipitation was carried out in methanol. The precipitated polymer was collected by filtration, air-dried overnight, re-dissolved in THF, and re-precipitated into methanol. The final polymer was filtered, air-dried overnight and further dried under vacuum at 25° C. for 48 hours to give polystyrene-co-poly(4-vinyl benzocyclobutene) [P(S-r-VBCB)] (90/10) [Mn: 22.2 k, PDI: 1.25, Td (degradation temperature): 384.70° C., Tg (glass transition temperature): 102.05° C.]

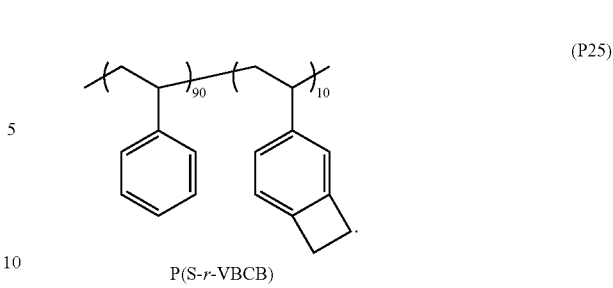

P(S-r-VBCB)

Polymer P26: P(S-r-VBCB) (97/03)

Styrene and 4-vinylbenzocyclobutene (VBCB) monomers were passed through an alumina column to remove inhibitors. 28.883 g of styrene, 1.117 g of VBCB, 0.2257 g of N-tert-butyl-N-(2-methyl-1-phenylpropyl)-O-(1-phenylethyl)hydroxylamine, and 0.0112 g of 2,2,5-Trimethyl-4-phenyl-3-azahexane-3-nitroxide were charged into a 100 mL Schlenk flask. The reaction mixture was degassed by three freeze-pump-thaw cycles and then the flask was charged with nitrogen and sealed. The reaction flask was next heated at 120° C. for 24 hours. The polymerization mixture was allowed to cool down to room temperature and was diluted with THF. Polymer precipitation was carried out in methanol. The precipitated polymer was collected by filtration, air-dried overnight, re-dissolved in THF, and re-precipitated into methanol. The final polymer was filtered, air-dried overnight and further dried under vacuum at 25° C. for 48 hours to give P(S-r-VBCB) (97/3) [Mn: 23.0 k, PDI: 1.30]

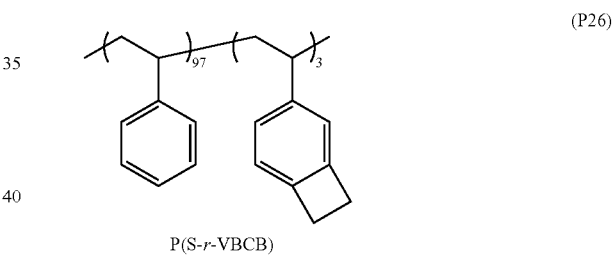

P(S-r-VBCB)

Gap-Fill Compositions and Solvent Strip Test

Thermal cross-linking reaction of the self-crosslinkable polymers was indirectly monitored by performing a solvent strip test. Each of Polymers P25 and P26 was dissolved in propylene glycol methyl ether acetate (PGMEA) (1.5 wt %) and the solution was filtered through a Teflon filter having a 0.2 micron pore size to provide Gap-fill Compositions 1 and 2, respectively. Each of the compositions was spin-coated on a respective bare Si wafer at 1500 rpm. The coated wafers were baked under a nitrogen environment (O$_2$ level below 100 ppm) at various temperatures and times to investigate thermal cross-linking behavior of the polymer. Subsequently, the films were thoroughly rinsed with PGMEA to remove uncross-linked materials. The thickness of the insoluble cross-linked random copolymer remaining on the substrates was measured. The results are shown in Table 1.

TABLE 1

| Gap-Fill Comp'n | Polymer | Annealing Temperature (° C.) | Annealing Time (min) | Thickness (Before Rinse) (nm) | Thickness (After Rinse) (nm) |
| --- | --- | --- | --- | --- | --- |
| 1 | P25 | 200 | 2 | 43.4 | <10 |
|  |  | 200 | 5 | 44 | <10 |

TABLE 1-continued

| Gap-Fill Comp'n | Polymer | Annealing Temperature (° C.) | Annealing Time (min) | Thickness (Before Rinse) (nm) | Thickness (After Rinse) (nm) |
|---|---|---|---|---|---|
| | | 200 | 10 | 43.6 | <10 |
| | | 200 | 30 | 41.3 | <10 |
| | | 250 | 2 | 42.1 | 18.3 |
| | | 250 | 5 | 40.9 | 41.1 |
| | | 250 | 10 | 41.2 | 39.6 |
| | | 250 | 30 | 42.2 | 39 |
| 2 | P26 | 200 | 2 | 43.4 | <10 |
| | | 200 | 5 | 44 | <10 |
| | | 200 | 10 | 43.6 | <10 |
| | | 200 | 30 | 41.3 | <10 |
| | | 250 | 2 | 42.1 | 18.5 |
| | | 250 | 5 | 40.9 | 22.5 |
| | | 250 | 10 | 41.2 | 27.6 |
| | | 250 | 30 | 42.2 | 42.3 |

Based on the results, effective crosslinking of the self-crosslinkable polymers P25 and P26 was achieved at the higher annealing temperature of 250° C. for 5 minutes for P25 and 250° C. for 30 minutes for P26. Since the glass transition temperature of these materials is approximately 100° C., it is expected that a gap-fill bake preferably from about 100° C. to 225° C. can be used without inducing a significant crosslinking reaction.

Gap-Fill Compositions

Gap-fill compositions are prepared by dissolving the polymers in solvents in the amounts as shown in Table 2. The solutions are filtered through a Teflon filter having a 0.2 micron pore size to provide gap-fill compositions.

TABLE 2

| Gap-fill Comp'n | Polymer (wt %*) | Solvent (wt %) |
|---|---|---|
| 3 | P-1 (3.2 wt %) | PGMEA |
| 4 | P-2 (3.2 wt %) | PGMEA |
| 5 | P-3 (3.2 wt %) | PGMEA |
| 6 | P-4 (3.2 wt %) | PGMEA |
| 7 | P-5 (3.2 wt %) | PGMEA |
| 8 | P-6 (3.2 wt %) | PGMEA |
| 9 | P-7 (3.2 wt %) | PGMEA |
| 10 | P-8 (3.2 wt %) | PGMEA |
| 11 | P-9 (3.2 wt %) | PGMEA |
| 12 | P-10 (3.2 wt %) | PGMEA |
| 13 | P-11 (3.2 wt %) | PGMEA |
| 14 | P-12 (3.2 wt %) | PGMEA |
| 15 | P-13 (3.2 wt %) | PGMEA |
| 16 | P-14 (3.2 wt %) | PGMEA |
| 17 | P-15 (3.2 wt %) | PGMEA |
| 18 | P-16 (3.2 wt %) | PGMEA |
| 19 | P-17 (3.2 wt %) | PGMEA |
| 20 | P-18 (3.2 wt %) | PGMEA |
| 21 | P-19 (3.2 wt %) | PGMEA |
| 22 | P-20 (3.2 wt %) | PGMEA |
| 23 | P-21 (3.2 wt %) | PGMEA |
| 24 | P-22 (3.2 wt %) | PGMEA |
| 25 | P-23 (3.2 wt %) | PGMEA |
| 26 | P-24 (3.2 wt %) | PGMEA |

*All weight percentages are based on total gap-fill composition.

Gap-Fill Example 1

Figure 3A:
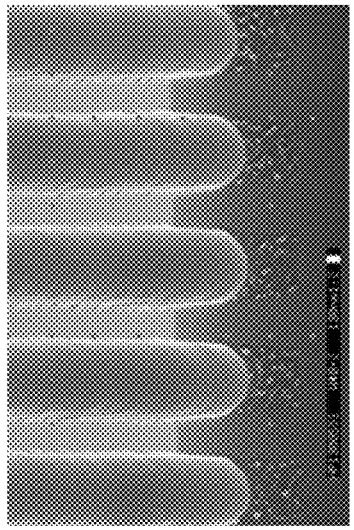
FIG. 3A-B are SEM photomicrographs showing pre- and post-filled trench patterns.
Figure 3B:
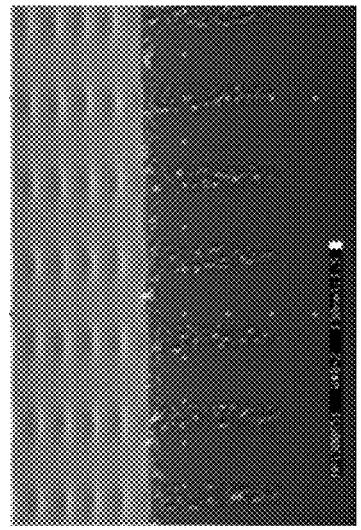
Figure 4A:
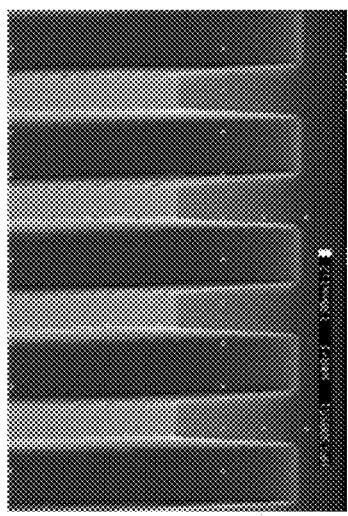
FIG. 4A-B are SEM photomicrographs showing pre- and post-filled contact hole patterns.
Figure 4B:
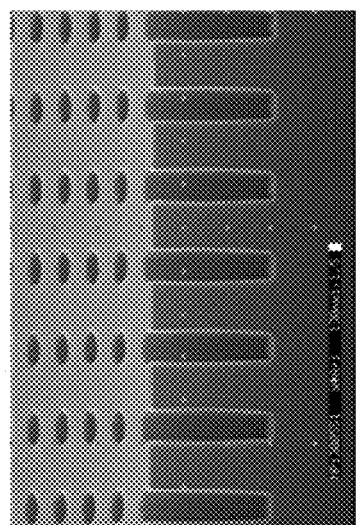

A patterned silicon oxide on silicon wafer segment was provided. The patterns included trenches having a width of 260 nm and 345 nm at the bottom and top of the trench, respectively, and a height of 576 nm, as shown in the SEM photomicrograph of FIG. 3A. The patterns also included contact holes having a diameter of 118 nm and 150 nm at the bottom and top, respectively, and a depth of 545 nm, as shown in SEM photomicrograph of FIG. 4A. Gap-fill Composition 1 was spin-coated over the patterned surface of the wafer segment at 2000 rpm to give a film thickness of about 144 nm. The coated gap-fill composition was next softbaked on a hotplate at 150° C. for 120 seconds to remove solvent from the composition. The composition was next heated at 250° C. for 120 seconds to cause the polymer to self-crosslink. The trench and contact hole patterns after crosslinking are shown in the SEM photomicrographs of FIGS. 3B and 4B, respectively.

Gap-Fill Example 2

Figure 5B:
FIG. 5A-B are SEM photomicrographs showing pre- and post-filled trench patterns.
Figure 5A:
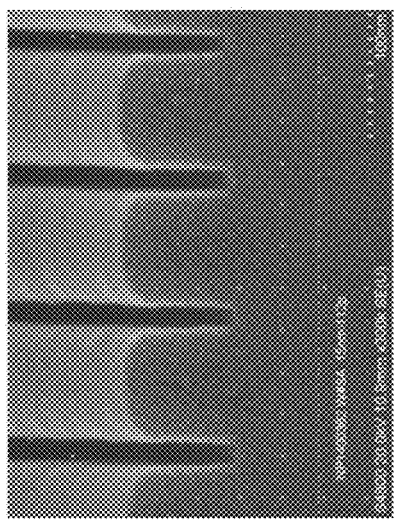

A gap fill composition was prepared by dissolving Polymer P25 in PGMEA (2.0 wt %) and the solution was filtered through a Teflon filter having a 0.2 micron pore size to provide Gap-fill Composition 27. A patterned silicon nitride on silicon wafer segment was provided. The patterns included trenches having a width of 15 nm and a height of 77 nm, as shown in the SEM photomicrograph of FIG. 5A. Gap-fill Composition 27 was spin-coated over the patterned surface of the wafer segment at 1500 rpm to overcoat the pattern. The coated gap-fill composition was next softbaked on a hotplate at 180° C. for 60 seconds to remove solvent from the composition. The filled trench patterns are shown in the SEM photomicrograph of FIG. 5B.

Gap-Fill Examples 3-28

Patterned LPCVD silicon dioxide-coated silicon wafers are provided. The patterns include trenches having a width of 15 nm and a height of 75 nm, and contact holes having a diameter of 20 nm and a depth of 100 nm. Gap-fill compositions 1-26 are: spin-coated on the patterned wafers, softbaked, gap-fill baked and crosslink-baked at the conditions described in Table 3. The bakes are conducted on a hot plate. It is expected that the trenches and contact holes are completely filled with crosslinked compositions following the gap-fill and crosslink bakes.

TABLE 3

| Example | Gap-fill Comp'n | Softbake Temp/Time (° C./sec) | Gap-Fill Bake Temp/Time (° C./min) | Crosslink Bake Temp/Time (° C./min) |
|---|---|---|---|---|
| 3 | 1 | 120/120 | 180/5 | 250/5 |
| 4 | 2 | 120/120 | 180/5 | 250/5 |
| 5 | 3 | 120/120 | 180/5 | 250/5 |
| 6 | 4 | 120/120 | 180/5 | 250/5 |
| 7 | 5 | 120/120 | 180/5 | 250/5 |
| 8 | 6 | 120/120 | 180/5 | 250/5 |
| 9 | 7 | 120/120 | 180/5 | 250/5 |
| 10 | 8 | 120/120 | 180/5 | 250/5 |
| 11 | 9 | 120/120 | 180/5 | 250/5 |
| 12 | 10 | 120/120 | 180/5 | 250/5 |
| 13 | 11 | 120/120 | 180/5 | 250/10 |
| 14 | 12 | 120/120 | 180/5 | 250/5 |
| 15 | 13 | 120/120 | 180/5 | 250/5 |
| 16 | 14 | 120/120 | 180/5 | 280/10 |
| 17 | 15 | 120/120 | 180/5 | 280/10 |
| 18 | 16 | 120/120 | 180/5 | 250/5 |
| 19 | 17 | 120/120 | 180/5 | 250/5 |
| 20 | 18 | 120/120 | 180/5 | 250/5 |
| 21 | 19 | 120/120 | 180/5 | 250/5 |
| 22 | 20 | 120/120 | 180/5 | 250/5 |
| 23 | 21 | 120/120 | 180/5 | 250/5 |
| 24 | 22 | 120/120 | 180/5 | 250/5 |
| 25 | 23 | 120/120 | 180/5 | 250/5 |
| 26 | 24 | 120/120 | 180/5 | 250/5 |

TABLE 3-continued

| Example | Gap-fill Comp'n | Softbake Temp/Time (° C./sec) | Gap-Fill Bake Temp/Time (° C./min) | Crosslink Bake Temp/Time (° C./min) |
|---|---|---|---|---|
| 27 | 25 | 120/120 | 180/5 | 250/5 |
| 28 | 26 | 120/120 | 180/5 | 250/30 |

What is claimed is:

1. A gap-fill method, comprising:
   (a) providing a semiconductor substrate having a relief image on a surface of the substrate, the relief image comprising a plurality of gaps to be filled;
   (b) applying a gap-fill composition over the relief image, wherein the gap-fill composition comprises a self-crosslinkable polymer and a solvent, wherein the self-crosslinkable polymer comprises a first unit comprising a polymerized backbone and a crosslinkable group pendant to the backbone; and
   (c) heating the gap-fill composition at a temperature to cause the polymer to self-crosslink.

2. The method of claim 1, wherein the crosslinkable group is an arylcyclobutene.

3. The method of claim 1, wherein the polymer further comprises a second unit chosen from general formulae (IV) and (V):

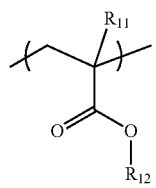

(IV)

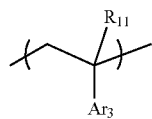

(V)

wherein $R_{11}$ is independently chosen from hydrogen, fluorine, $C_1$-$C_3$ alkyl and $C_1$-$C_3$ fluoroalkyl, $R_{12}$ is chosen from optionally substituted $C_1$ to $C_{10}$ alkyl, and $Ar_3$ is an aryl group.

4. The method of claim 2, wherein the first unit and the second unit are

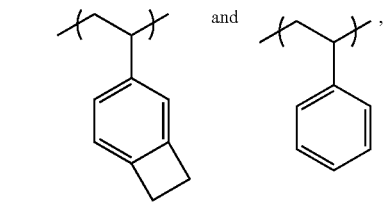

respectively.

5. The method of claim 1, wherein the self-crosslinkable polymer has a weight average molecular weight of less than 50,000 and a polydispersity index of less than 1.5.

6. The method of claim 1, wherein the gap-fill composition is free of additive crosslinking agents.

7. The method of claim 1, wherein the gaps have a width of less than 50 nm and an aspect ratio of 2 or more.

8. The method of claim 1, further comprising prior to causing the gap fill composition to self-crosslink, heating the gap-fill composition at a temperature to cause the gap-fill composition to fill the plurality of gaps.

9. The method of claim 8, wherein the temperature to cause the gap-fill composition to fill the plurality of gaps is at least 15° C. lower than the temperature to cause the polymer to self-crosslink.

10. The method of claim 8, wherein the heating to fill the plurality of gaps and the heating to self-crosslink are conducted in a single process.

* * * * *